United States Patent
Parker et al.

(10) Patent No.: US 10,324,372 B2
(45) Date of Patent: Jun. 18, 2019

(54) MULTI-TONE AMPLITUDE PHOTOMASK

(71) Applicant: Marsupial Holdings, Inc., Waitsfield, VT (US)

(72) Inventors: William P. Parker, Waitsfield, VT (US); Julie Parker, Waitsfiled, VT (US)

(73) Assignee: Marsupial Holdings, Inc., Waitsfield, VT (US)

( * ) Notice: Subject to any disclaimer, the term of this patent is extended or adjusted under 35 U.S.C. 154(b) by 156 days.

(21) Appl. No.: 15/641,941

(22) Filed: Jul. 5, 2017

(65) Prior Publication Data

US 2017/0299960 A1    Oct. 19, 2017

Related U.S. Application Data

(63) Continuation of application No. PCT/US2016/012242, filed on Jan. 5, 2016.

(60) Provisional application No. 62/100,062, filed on Jan. 5, 2015.

(51) Int. Cl.
| | | |
|---|---|---|
| *G03F 1/22* | (2012.01) | |
| *G03F 1/50* | (2012.01) | |
| *G03F 1/68* | (2012.01) | |
| *G03F 1/80* | (2012.01) | |
| *G03F 7/00* | (2006.01) | |
| *G03F 7/20* | (2006.01) | |
| *G03F 7/36* | (2006.01) | |
| *H01L 21/033* | (2006.01) | |

(52) U.S. Cl.
CPC .................. *G03F 1/80* (2013.01); *G03F 1/22* (2013.01); *G03F 1/50* (2013.01); *G03F 1/68* (2013.01); *G03F 7/0005* (2013.01); *G03F 7/2004* (2013.01); *G03F 7/36* (2013.01); *H01L 21/0334* (2013.01)

(58) Field of Classification Search
CPC ..... G03F 1/22; G03F 1/50; G03F 1/68; G03F 1/80; G03F 7/0005; G03F 7/2004; G03F 7/36; H01L 21/0334
USPC ............................................. 430/5
See application file for complete search history.

(56) References Cited

U.S. PATENT DOCUMENTS 8,685,596 B2 *   4/2014   Gao .................. G03F 1/50
430/5

* cited by examiner

*Primary Examiner* — Christopher G Young
(74) *Attorney, Agent, or Firm* — Justin W. McCabe; Dunkiel Saunders Elliott Raubvogel & Hand PLLC

(57) ABSTRACT

A method of fabricating a multi-tone amplitude photomask includes providing a mask substrate. The method includes providing a stepped pattern in at least one layer of material on a surface of the mask substrate. The stepped pattern includes at least two steps and at least three levels. Each level of the stepped pattern provides a different intensity of light when a light source shines light on the stepped pattern.

23 Claims, 15 Drawing Sheets

Illuminate with UV Light

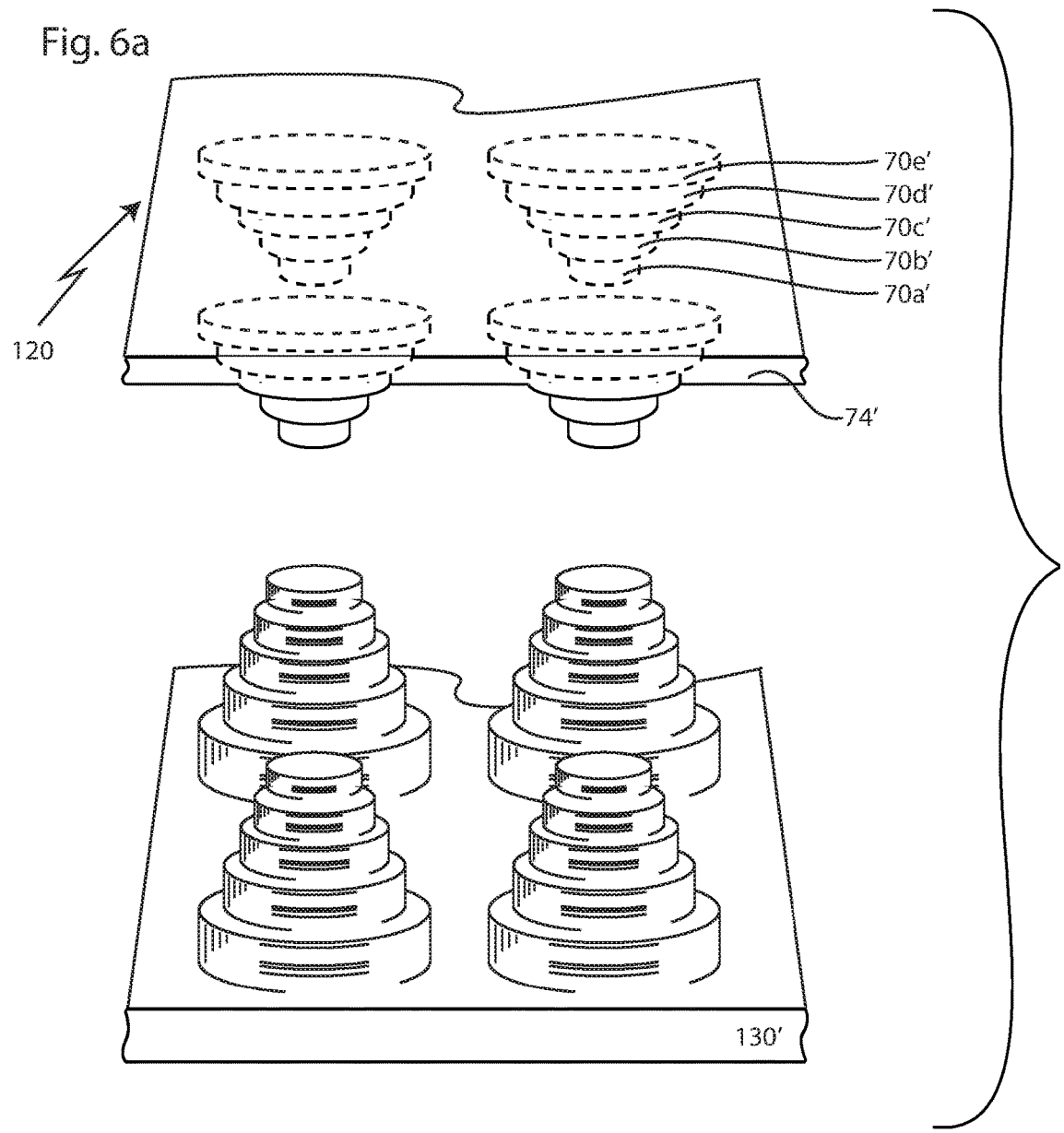

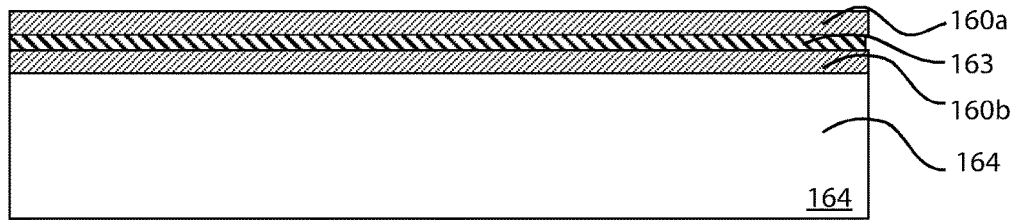
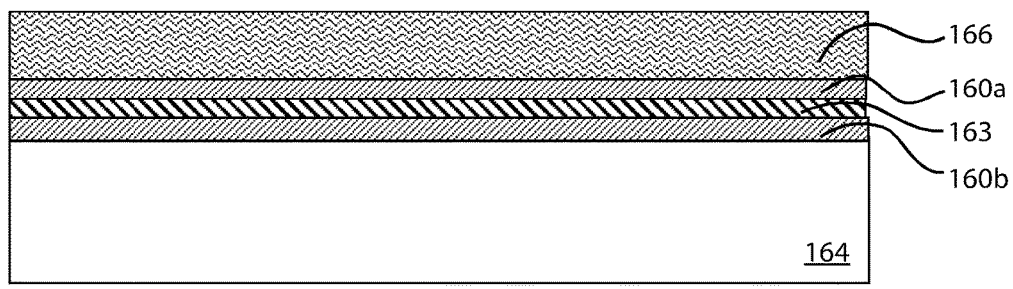
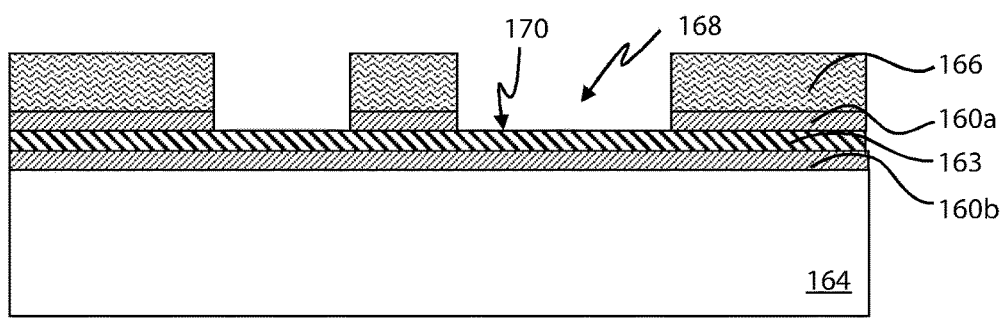
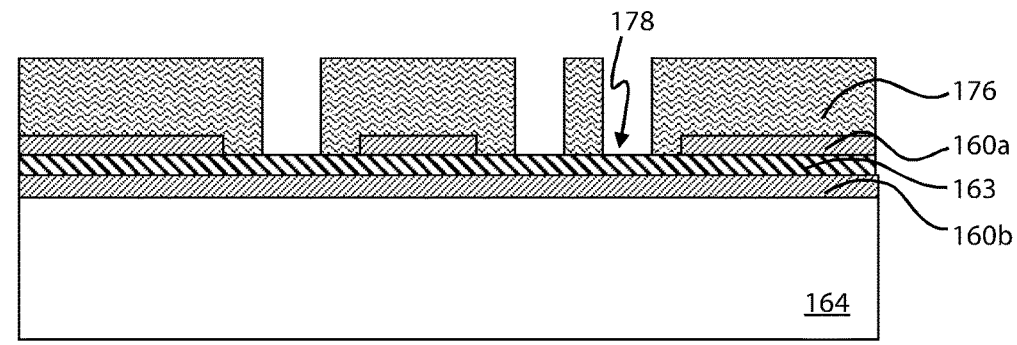

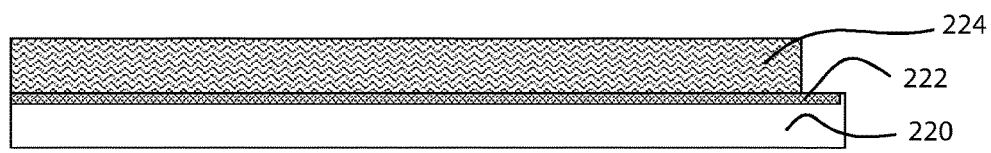

US 10,324,372 B2

MULTI-TONE AMPLITUDE PHOTOMASK

FIELD

This patent application generally relates to a way of providing a multi-tone photomask. More particularly, it relates to a scheme for making a photomask that has multiple levels of optical density. Even more particularly, it relates to a scheme for making a photomask that provides a pattern on a workpiece with several different heights of photoresist.

BACKGROUND

Multilayer structures have been formed on substrates with multiple masking steps. Each mask level has been aligned to a previous mask level, introducing alignment error. So each wafer may have slightly different alignments from others. Thus, products formed on different wafers will have different misalignments and will be different from each other. In addition, each masking step has required a substantial amount of time, and multiple masking steps have required a multiple of this processing time for manufacturing the products. In addition, each mask and each masking step has a substantial cost. Applicants recognized that better schemes than those available are needed, and such solutions are provided by the following description.

SUMMARY

One aspect of the present patent application is a method of fabricating a multi-tone amplitude photomask. The method includes providing a mask substrate. The method also includes providing a stepped pattern in at least one layer of material on a surface of said mask substrate. The stepped pattern includes at least two steps and at least three levels. Each level of the stepped pattern provides a different intensity of light when a light source shines light on the stepped pattern.

BRIEF DESCRIPTION OF THE DRAWINGS

The foregoing will be apparent from the following detailed description, as illustrated in the accompanying drawings, in which:

FIG. 6a is a three dimensional view of a multi tone amplitude photo mask with 6 levels formed by the process of the present patent application in a stepped cone pattern and the 6 levels formed in photo resist on the substrate in a stepped cone pattern using this photomask;

FIGS. 7a-7g are cross sectional views showing an embodiment of a process for fabricating a multi-tone amplitude photomask of the present patent application in which top and bottom layers are the same material with an etch-stop layer there between;

DETAILED DESCRIPTION

The present applicants created methods of making and using a multi-tone amplitude photomask. The multi-tone amplitude photomask has multiple levels of optical density. Developing photoresist on a workpiece after exposure using the mask results in a patterned photoresist with a three-dimensional structure, which is a pattern with several different heights of photoresist on the workpiece.

In one embodiment, to fabricate a a multi-tone amplitude photomask, a mask substrate is provided and a stepped pattern is provided in at least one layer of material on a surface of the mask substrate. The stepped pattern includes at least two steps and at least three levels. Each level of the stepped pattern provides a different level of intensity of light when measured at the mask when a light source shines light on the stepped pattern.

In one embodiment, the multiple levels of optical density on the multi-tone amplitude photomask are produced by providing multiple layers of light attenuating materials. Each of the layers is patterned individually. Each layer has an attenuation or optical density that depend on material characteristic and thickness. A photomask having two layers of light attenuating materials will produce 3 levels of attenuation of incident light for the exposure: no attenuation where both layers have been etched, the attenuation because of the optical density of the bottom layer in areas where the top layer has been etched and attenuation because of the optical density of both layers combined where neither layer has been etched.

More layers of light attenuating material can be provided and the provision of more layers of light attenuating material on the substrate will allow more levels of attenuation and more different heights in the exposed and developed photoresist on the workpiece.

Figure 1A:
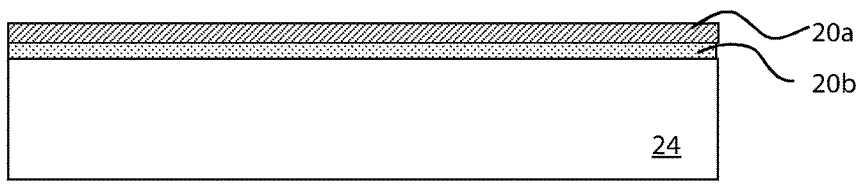
FIGS. 1a-1f are cross sectional views showing one embodiment of a process for fabricating a multi-tone amplitude photomask of the present patent application with 2 layers of material and 3 levels.

In one embodiment a two layer structure, including at least one layer of a partially transparent material is blanket deposited on a transparent substrate to begin the fabrication of the 2-layer multi-tone amplitude photomask, as shown in FIG. 1a. In this embodiment, bottom layer 20b is a different material and has a different etch chemistry than top layer 20a so that when top layer 20a is etched bottom layer 20b is not. In one example, top layer 20a is nickel and bottom layer 20b is chromium. Mask substrate 24 is a transparent material, such as glass, quartz, or fused silica. Although described in terms of partial transparency for a reflection mask, it is understood that the process is the same for fabricating a transmission and for fabricating a reflection mask, and in the case of a reflection mask the at least one layer is of a partially reflective material.

Figure 2A:
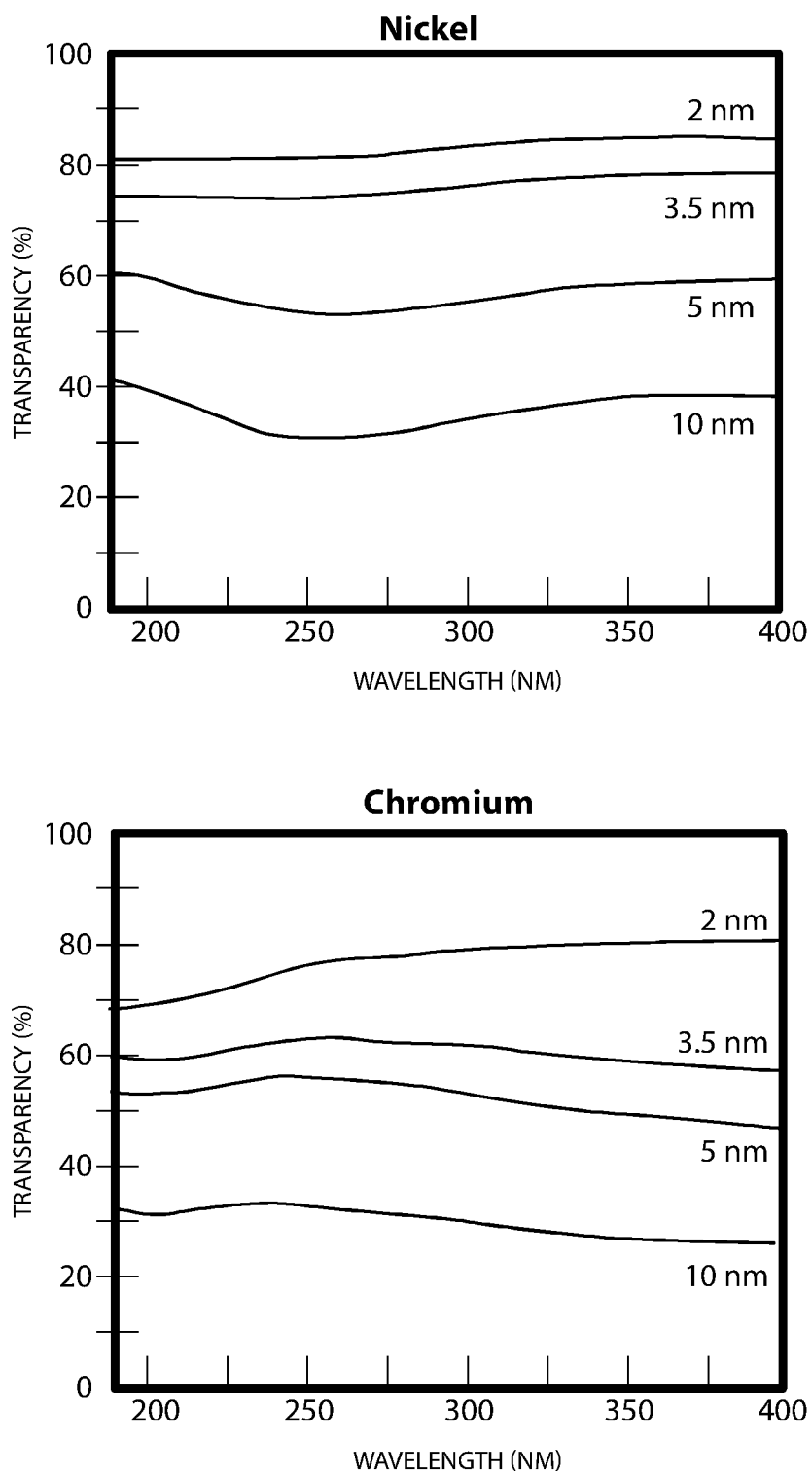
FIG. 2a is a graph showing transparency v. wavelength for various thicknesses of nickel and chromium respectively.

The light dose reaching photoresist on a workpiece through both layers 20a and 20b depends on the thicknesses of layers 20a, 20b. In one embodiment, bottom layer 20b is about 5 nm thick to provide about half the applied UV dose penetrating through bottom layer 20b when this bottom layer is alone on mask substrate 24. Substantially less UV light passes through in regions having both top layer 20a and bottom layer 20b depending on the thickness of top layer 20a. For example, if top layer 20a is 5 nm thick as well, as shown in the graphs in FIG. 2a, transparency for light going through both layers is reduced to about 30%. Top layer 20a can be thicker to permit less light to pass through both layers and to reduce the exposure of the photoresist in regions under both layers. For example, top layer can be in the range from 5 nm to 100 nm thick. Other thicknesses of nickel and chromium can be used to tailor vertical dimensions of the photoresist after development on a workpiece exposed using this mask. For example top layer can be in the range from 5 nm to 300 nm.

Alternatively to thin metal layers, dielectric materials, such as silicon dioxide and silicon nitride, titanium dioxide, hafnium oxide, and tantalum pentoxide can be used with thicknesses tailored to provide partial transparency or partial reflectivity to a predetermined wavelength of light that will be used with the mask. For improved transmitivity or reflectivity multiple layers of high and low index materials are used. For example, while a thickness equal to a quarter wave in the material would provide maximum transmission through a dielectric layer and while a thickness equal to a half wave in the material would provide maximum reflection, a thickness adjusted between a quarter wave and a half wave would provide partial transmission and partial reflection. In addition to metals and dielectrics, other partially transparent materials can be used, such as dyed polymer.

Top and bottom metal or dielectric layers 20a, 20b can be deposited by techniques, such as evaporation, chemical vapor deposition, sputtering, and physical vapor deposition. For a dyed material thicker layers can be deposited and spinning, spraying, or roll-on deposition can be used.

Figure 1B:
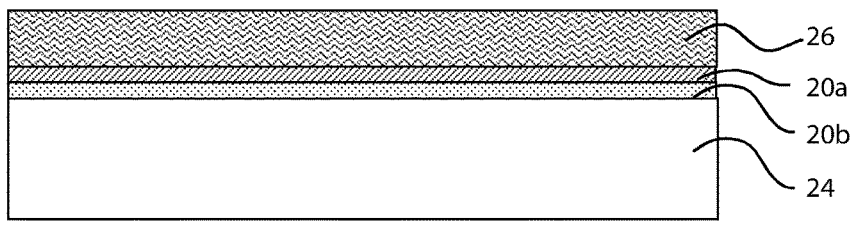
Figure 1C:
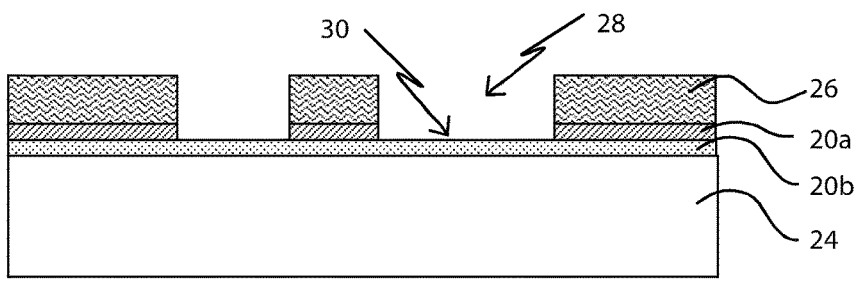
Figure 10A:
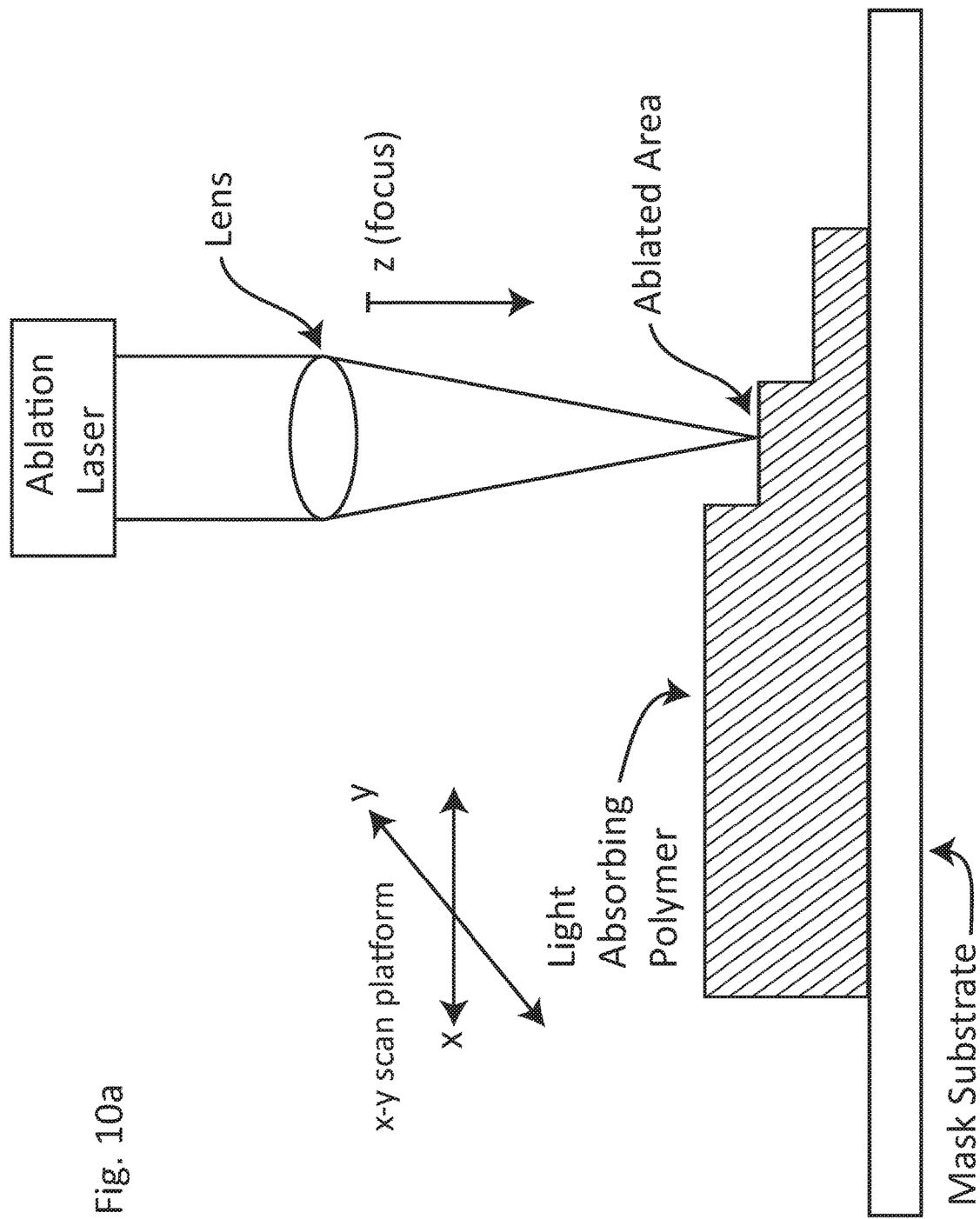
FIG. 10a is a cross sectional view showing laser ablation of a light absorbing polymer on a mask substrate to form a stepped pattern in the light absorbing polymer.
Figure 10B:
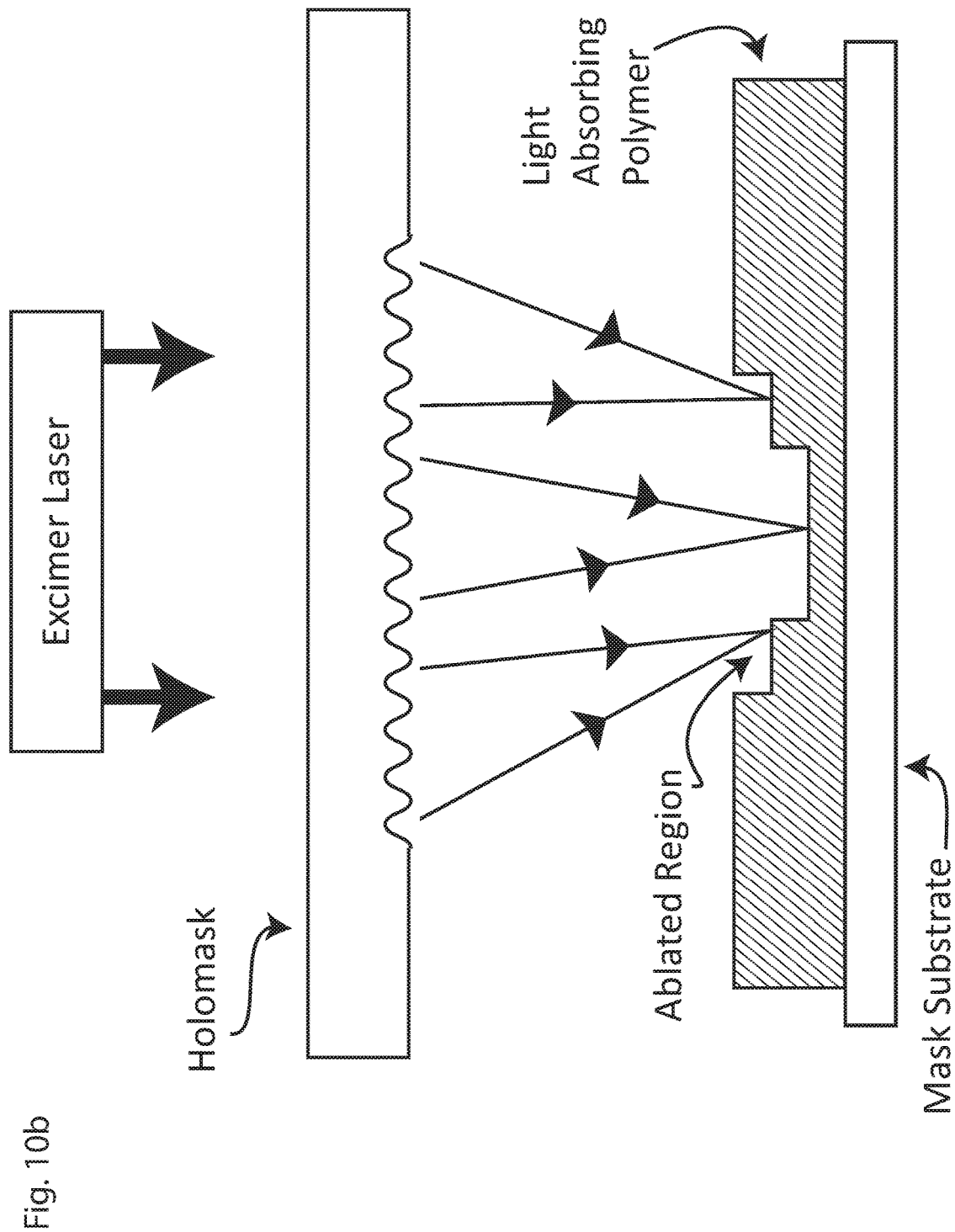
FIG. 10b is a cross sectional view showing use of a holographic mask for laser ablation of a light absorbing polymer on a mask substrate to form a stepped pattern in the light absorbing polymer.

Once top and bottom layers 20a, 20b have been deposited, first layer of resist 26 is deposited, as shown in FIG. 1b and patterned to form first openings 28 in patterned first layer of resist 26, as shown in FIG. 1c. In one embodiment first layer of resist 26 is photoresist and the patterning to form first openings 28 is with UV light through a mask followed by developer. Other techniques, such as laser writing or electron beam writing of the pattern in the first layer of resist 26 can be used for the exposure. X-ray exposure of photoresist 26 with a mask can also be used. Alternatively, laser writing with a beam to ablate a light absorbing polymer, such as polymethyl methacrylate (PMMA) with a UV absorbing dye, or a photoresist, to a desired depth can also be used, as shown in FIG. 10a. Alternatively, a holographic mask can be used with a laser to provide ablating a stepped pattern in a light absorbing polymer on a mask substrate, as shown in FIG. 10b. In another alternative, a process such as stencil screen printing or roll-on masking material can be used to provide the patterned first layer of resist during its deposition.

Top layer of material 20a is etched away in conformance to first openings 28 in first layer of resist 26, as also shown in FIG. 1c. In one embodiment, top layer of material 20a is nickel, and is etched away with Transene Nickel Etch TFG in first openings 28 in first layer of resist 26 to form top layer openings 30 in top layer of material 20a. As Transene Nickel Etch TFG will not etch chromium of bottom layer of material 20b under the nickel, bottom layer of material 20b remains fully in place, as also shown in FIG. 1c.

Figure 1D:
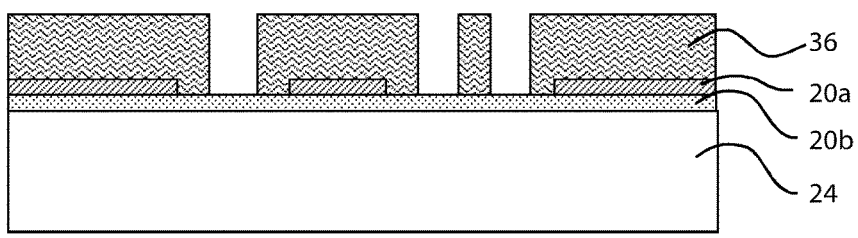

First layer of resist 26 is now stripped off and a second layer of resist is deposited and patterned to form second openings 38 in patterned second layer of resist 36, as shown in FIG. 1d. In this embodiment, second openings 38 in patterned second layer of resist 36 are within top layer openings 30 in top layer of material 20a, as also shown in FIG. 1d. In one embodiment second layer of resist 36 is photoresist and the patterning to form second openings 38 includes aligning to alignment marks and exposing with UV light through a mask followed by developer. Other techniques, such as laser writing or electron beam writing of the pattern in the second layer of resist 36 can be used for the exposure. X-ray exposure of photoresist 36 with a mask can also be used. Alternatively, laser writing with a beam to ablate a light absorbing polymer, such as resist, to a desired depth can be used. In another alternative, a process such as stencil screen printing, roll-on masking material, and ink-jet printing can be used to provide the patterned second layer of resist aligned with the first layer.

Figure 1E:
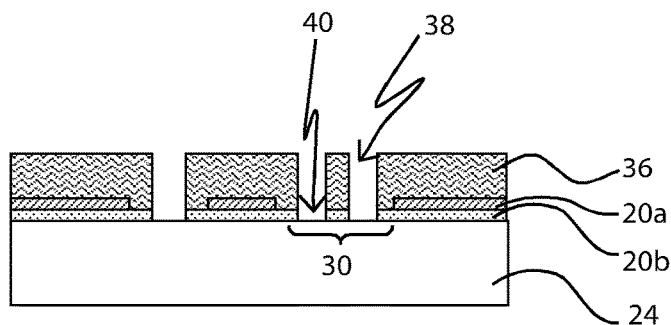

As shown in FIG. 1e, bottom layer of material 20b is now etched in conformance to second openings 38 in second layer of resist 36. In one embodiment, bottom layer of material 20b is chromium and is etched away with Transene Chromium Etch TFE in second openings 38 in second layer of resist 36 to form bottom layer openings 40 in bottom layer of material 20b. As Transene Chromium Etch TFE will not etch nickel of top layer of material 20a, and as nickel layer 20a is also protected by second layer of resist 36 in this embodiment, top layer of material 20a outside of first openings 30 remains fully in place, as shown in FIG. 1e.

Figure 1F:
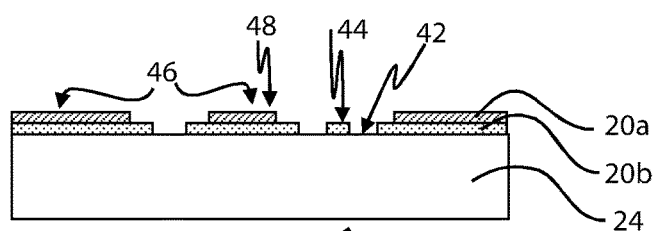

Finally, 2-layer multi-tone amplitude photomask 50 is completed when second photoresist 36 is stripped off, leaving three regions of mask substrate 24. Regions 42 of mask substrate 24 have neither bottom layer of material 20b nor top layer of material 20a; regions 44 of mask substrate 24 have bottom layer of material 20b but do not have top layer of material 20a, and regions 46 of mask substrate 24 have both bottom layer of material 20b and top layer of material 20a, as shown in FIG. 1f. In certain regions, bottom layer of material 20b and top layer of material 20a are arranged in staircase, stepped pyramid, or stepped cone shaped pattern 48 on mask substrate 24 while in other regions bottom layer 20b is by itself.

Figure 3A:
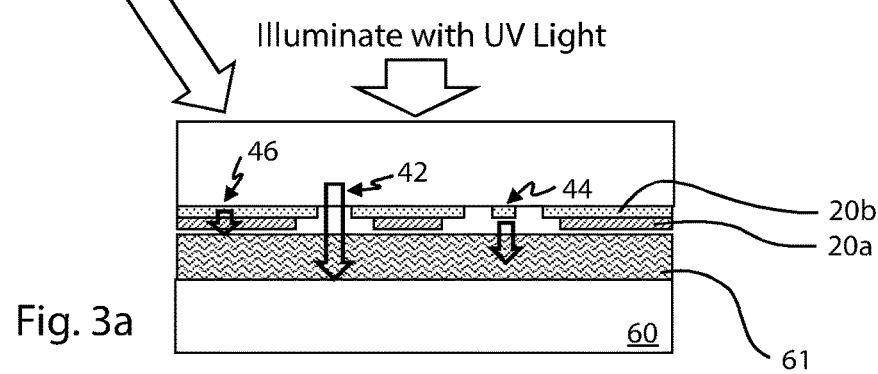
FIGS. 3a-3b are cross sectional views of a process of using the multi-tone amplitude photomask of FIG. 1f to expose and develop photo resist on a workpiece to provide a three dimensional pattern, such as a staircase, stepped pyramid, or stepped cone pattern in the photo resist with 3 levels.
Figure 3B:
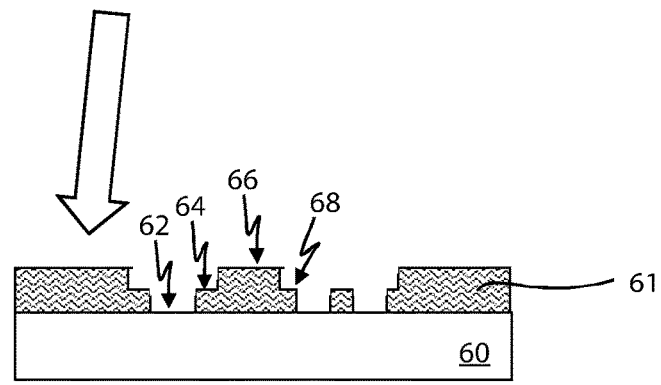

Staircase, stepped pyramid, or stepped cone shaped pattern 48 in multi-tone amplitude photomask 50 is reproduced in photoresist on workpiece 60 with a mask exposure, as shown in FIGS. 3a-3b. First, workpiece 60, such as a semiconductor wafer, is coated with workpiece photoresist 61, as shown in FIG. 3a, and exposed to UV light shining through multi-tone amplitude photomask 50. Photoresist 61 has a thickness many times greater than the thickness of staircase, stepped pyramid, or stepped cone shaped pattern 48 in multi-tone amplitude photomask 50. In one embodiment, photoresist 61 is about 1 micron thick, which is about 100 times the full thickness of metal layers on photomask 50. Photoresist 61 typically has a thickness in the range from 0.5 to 3 microns and can be in the range from 0.1 to 100 microns and even up to millimeters thick.

A technique, such as contact printing or providing multi-tone amplitude photomask 50 in a projection aligner, a stepper, or a projection scanner is used for exposing photoresist layer 61 on workpiece 60 with photomask 50.

As both transmittivity and reflectivity are dependent on metal thickness on photomask 50, photoresist layer 61 on workpiece 60 can be exposed either in transmission or reflection mode. If dielectric coatings or stacks of dielectric coatings or different metals with different inherent reflectivities are used on photo mask 50 reflection mode can also be used.

In addition to UV light for exposing photoresist, other wavelengths can be used for exposing a photosensitive layer on a workpiece using photomask 50, including X-ray, visible, and infrared. Light sources, such as a mercury or xenon lamp, a laser, or an X-ray machine can be used.

If laser or electron beam writing is used to provide the patterned layers of material in the multi-tone amplitude photomask, mask generation can take many hours. However, the multi-tone amplitude photomask, once generated, can be used many times over to quickly expose photoresist on many workpieces saving a great deal of processing time for creating a desired 3-dimensional pattern in photoresist on the workpieces. Applicant found that processing time for exposing photoresist on each workpiece with the multi-tone amplitude photomask was in the range of minutes as compared to the prior art process of laser writing photoresist on each workpiece to create a 3-dimensional pattern in the photoresist, which took many hours.

Regions 42 on mask substrate 24 with neither bottom layer of material 20b nor top layer of material 20a allow the UV light used in the multi-tone amplitude photomask exposure to strike photoresist 61 on workpiece 60 unimpeded. Regions 44 of mask substrate 24 with bottom layer of material 20b but not top layer of material 20a allow enough light through material 20b to sufficiently expose a top portion of photoresist 61 on workpiece 60. Regions 46 of mask substrate 24 with both bottom layer of material 20b and top layer of material 20a do not allow enough light through both layers of material 20a, 20b to expose any substantial portion of photoresist 61 on workpiece 60.

Thus, after developing, a pattern in mask 50 with three distinct heights of material in regions 42, 44, 46 on mask substrate 24, is reproduced in photoresist 61 on workpiece 60 as photoresist regions 62, 64, 66, such as staircase, stepped pyramid, or stepped cone shaped pattern 68 with its three heights, as shown in FIG. 3b: zero photoresist in region 62, about half the photoresist remaining in region 64, and full height photoresist in region 66.

In one experiment, AZ 4330 photoresist, Clariant Corporation AZ Electronic Materials, Somerville N.J., was spin applied to semiconductor wafer workpieces. The workpieces with 3 microns of photoresist were pre-exposure baked at 105° C. for 15 minutes. They were exposed through the multi-tone amplitude photomask using an Oriel mask aligner with a 400 Watt mercury lamp for about 30 seconds to achieve about 100 mJ/cm$^2$. The workpieces were developed in AZ 400K diluted 3:1 for 60 seconds. Resulting photoresist topology was measured on a KLA/Tencor P-2 stylus profilometer.

Figure 2B:
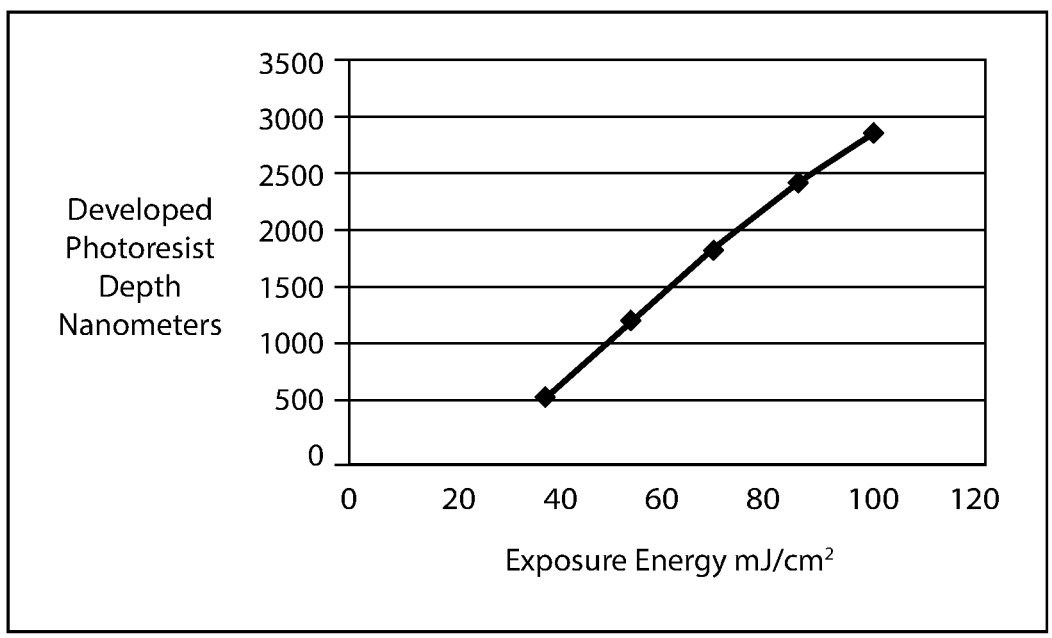
FIG. 2b is a graph showing developed photo resist depth v. exposure energy.

A graph showing developed photoresist depth as a function of exposure energy with the AZ 4330 photoresist under these bake, exposure, and develop conditions is provided in FIG. 2b. The graph shows that the top 0.5 micron of resist is developed out when the dose is about 38 mJ/cm$^2$, 1.0 microns when the energy dose is about 50 mJ/cm$^2$, 1.5 micron when the energy dose is about 60 mJ/cm$^2$, 2.0 microns when the energy dose is about 72 mJ/cm$^2$, 2.5 microns when the energy dose is about 84 mJ/cm$^2$, and 3.0 microns when the energy dose is about 100 mJ/cm$^2$.

Figure 4A:
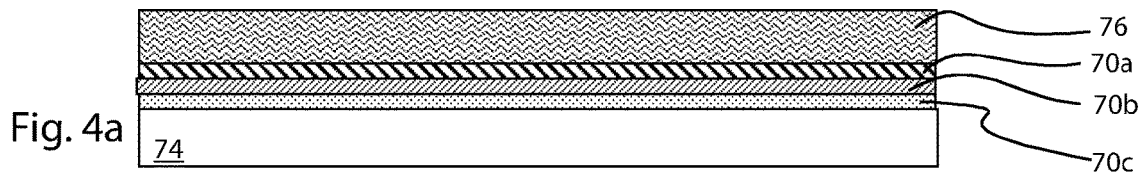
FIGS. 4a-4e are cross sectional views showing an embodiment of a process for fabricating a multi-tone amplitude photomask of the present patent application with 3 layers of material and 4 levels.
Figure 4B:
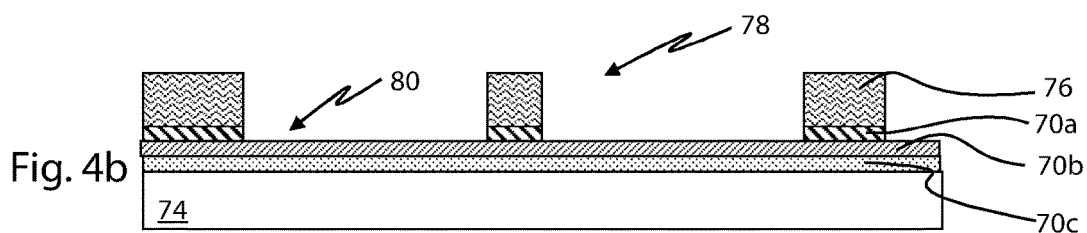
Figure 4C:
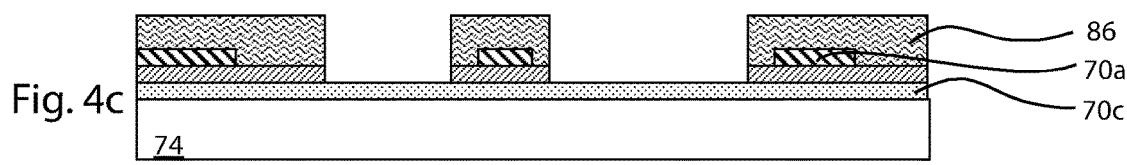
Figure 4D:
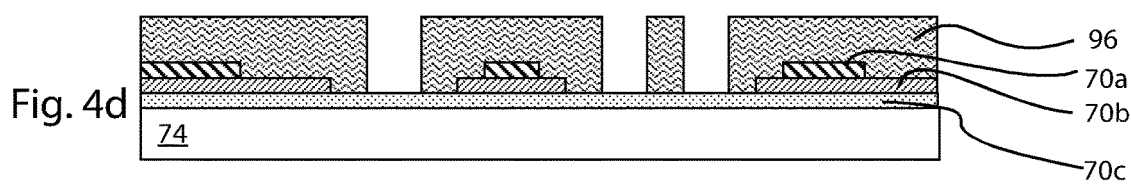
Figure 4E:
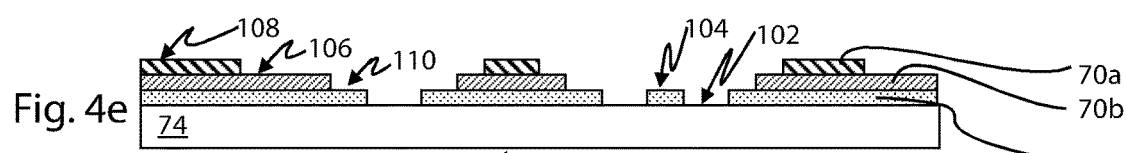
Figure 5A:
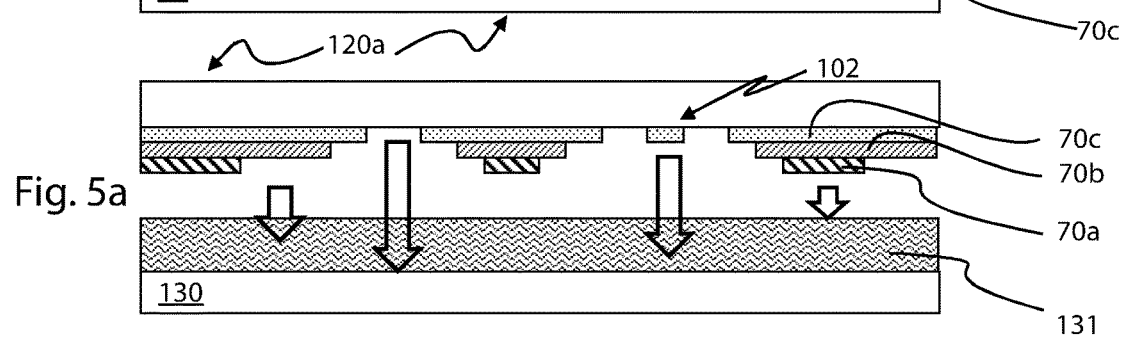
FIGS. 5a-5b are cross sectional views of a process of using the multi-tone amplitude photomask of FIG. 4e to expose and develop photo resist on a workpiece to provide a three dimensional pattern, such as a staircase, stepped pyramid, or stepped cone pattern in the photo resist with 4 levels.
Figure 5B:
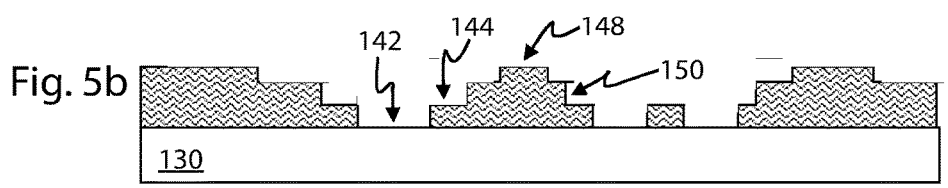

In another embodiment, 3 layers of material are formed on a transparent substrate, as shown in FIGS. 4a-4e, and the resulting four exposure levels are similarly transferred to photoresist on a workpiece with a mask exposure, as shown in FIGS. 5a-5b, to make a 4-level 3-dimensional structure in the photoresist. In this embodiment the 3-layer structure includes at least two layers of partially transparent material or at least two layers of partially reflective material. The 3 layers of partially transparent or reflective material are deposited as blanket layers on a transparent mask substrate to begin the fabrication of the multi-tone amplitude photomask, as shown in FIG. 4a. In one example, top layer 70a is copper, middle layer 70b is nickel, bottom layer 70c is chromium, and mask substrate 74 is glass, quartz, or fused silica. Bottom layer 70c is 2 or 3 nm thick to provide partial transparency to UV light when this bottom layer is alone on mask substrate 74. Middle layer is also 2 or 3 nm thick to still provide partial transparency to UV light when both middle layer 70b and bottom layer 70c are on mask substrate 74.

In the reflection mode this same construction of metal layers would operate in a reverse manner with the substrate reflecting the least light onto the workpiece and the multiple layers above it reflecting the most. It is also possible for the stack of coatings to be absorbing and to be placed on a reflective substrate such as aluminum or an aluminum coated fused silica substrate such that the greatest reflection would come from the substrate layer, with each successive layer above it absorbing more light and thus reflecting less light.

Top layer is sufficiently thick so very little UV light passes through in regions having all three layers or so insufficient light passes through all three layers to reach the threshold exposure needed by the photoresist used on the workpiece for any photoresist to be developed out. For example, top layer 70a is 10 or 20 nm thick. Top layer 70a can be thicker. Other thicknesses of copper, nickel, and chromium can be used to tailor vertical dimensions of the photoresist on a workpiece exposed using this mask to provide a desired 3-dimensional structure in the photoresist.

As described herein above, other partially absorbing materials can be used, such as dielectric layers or dye containing polymer layers. Top, middle, and bottom partially transmitting layers 70a, 70b, 70c are each deposited on mask substrate 74 by a technique, such as evaporation, chemical vapor deposition, sputtering, and physical vapor deposition.

Once top, middle, and bottom layers 70a, 70b, 70c have been deposited on mask substrate 74, first layer of resist 76 is deposited and patterned to form first openings 78 in patterned first layer of resist 76, as shown in FIG. 4b. In one embodiment first layer of resist 76 is photoresist and the patterning to form first openings 78 in first layer of resist 76 is with UV light through a mask followed by developer. Other exposure techniques, such as laser or electron beam writing exposure or X-ray exposure of the resist can be used. Alternatively, a process such as stencil screen printing or roll-on masking material is used to provide the patterned first layer of resist during its deposition.

Top layer of material 70a is etched away in conformance to first openings 78 in first layer of resist 76, as also shown in FIG. 4b. In the embodiment in which top layer of material 70a is copper, it may be etched away with Transene copper etch APS-100, available from Transene Company, Inc., Danvers, Mass. Thus, top layer openings 80 in top layer of material 70a are formed while the copper etchant does not affect nickel of middle layer of material 70b under the copper, so middle layer of material 70b and bottom layer 70c remain fully in place, as also shown in FIG. 3b.

First layer of resist 76 is now stripped off and second layer of resist 86 is deposited and patterned to form second openings 88 in patterned second layer of resist 86, as shown in FIG. 4c. The patterning to form second openings 88 in second layer of resist 86 is with UV light through a mask, using laser or electron beam writing exposure or X-ray exposure of second layer of resist 86. Alternatively, a process such as stencil screen printing or roll-on masking material is used to provide the patterned second layer of resist during its deposition. In this embodiment, second openings 88 in patterned second layer of resist 86 are within top layer openings 80 in top layer of material 70a, as also shown in FIG. 3c.

Middle layer of material 70b is etched in conformance to second openings 88 in second layer of resist 86, as also shown in FIG. 4c. In the embodiment in which middle layer of material 70b is nickel and is etched away with Transene nickel etch TFG in second openings 88 in second layer of resist 86 to form middle layer openings 90 in middle layer of material 70b. As the Transene nickel etchant will not etch chromium of bottom layer of material 70c, and as copper layer 70a is protected by second layer of resist 86, top layer of material 70a outside of first openings 80 remains fully in place and bottom layer of material 70c remains fully in place, as shown in FIG. 4c.

Second layer of resist 86 is now stripped off and a third layer of resist 96 is deposited and patterned to form third openings 98 in patterned third layer of resist 96, as shown in FIG. 4d. The patterning to form third openings 98 in third layer of resist 96 is with UV light through a mask, using laser or electron beam writing exposure or X-ray exposure of second layer of resist 96. Alternatively, a process such as stencil screen printing or roll-on masking material is used to provide the patterned second layer of resist during its deposition. In this embodiment, third openings 98 in patterned third layer of resist 96 are within middle layer openings 88 in middle layer of material 70b, as also shown in FIG. 4d.

Bottom layer of material 70c is etched in conformance to third openings 98 in third layer of resist 96, as also shown in FIGS. 4d, 4e. In the embodiment in which bottom layer of material 70c is chromium, it is etched away with Transene Chromium Etch TFE in third openings 98 in third layer of resist 96 to form bottom layer openings 100 in bottom layer of material 70c extending to mask substrate 74.

Finally, multi-tone amplitude photomask 101 is completed when third photoresist 96 is stripped off, leaving four regions on mask substrate 74, as also shown in FIG. 4e. Regions 102 on mask substrate 74 have neither bottom, middle or top layer of material 70a, 70b, 70c; regions 104 on mask substrate 74 have only bottom layer of material 70c; regions 106 on mask substrate 74 have only bottom layer of material 70c and middle layer of material 70b; regions 108 on mask substrate 74 have all three: bottom, middle, and top layers 70a, 70b, 70c, as shown in FIG. 4e. In certain regions, the three layers of material 20b are arranged in stepped pattern 110 on mask substrate 74. When viewed in three dimensions, stepped pattern 110 can be a staircase, a stepped pyramid, or a stepped cone.

Stepped pattern 110 provided in 3-layer multi-tone amplitude photomask 120 is reproduced in photoresist on workpiece 130, as shown in FIGS. 5a-5b. First, workpiece 130, such as a semiconductor wafer, is coated with workpiece photoresist 131, as shown in FIG. 5a, and exposed to UV light shining through 3-layer multi-tone amplitude photomask 120. A technique, such as contact printing or providing 3-layer multi-tone amplitude photomask 120 in a projection aligner or scanner is used for the exposure.

Regions 102 on mask substrate 74 with neither bottom, middle, or top layer of material 70c, 70b, 70a allow the exposure light, such as UV light, to strike photoresist 131 on workpiece 130 unimpeded. Regions 104 of mask substrate 74 with bottom layer of material 70c but not middle or top layer of material 70b, 70a allow enough light through bottom layer material 70c to sufficiently expose a top portion of photoresist 131 on workpiece 130. Regions 106 of mask substrate 74 with both bottom and middle layers of material 70c, 70b allow less light through but still allow enough for an exposure closer to the top surface of resist 131. Regions 108 of mask substrate 74 with all three, bottom, middle and top layers of material 70c, 70b, 70a have enough material blocking light to prevent any part of photoresist 61 on workpiece 60 from being sufficiently exposed so developer does not remove material. Thus, upon developing, a pattern with four distinct heights 142, 144, 146, 148 is formed in photoresist 131 on workpiece 130, as shown in FIG. 5b to create a 3-dimensional structure: zero photoresist in region 142, about one third height photoresist in region 144, about two thirds height photoresist in region 146 and full height photoresist in region 148.

More thin metal layers can be formed on transparent mask substrate 74, as shown with 5-layer multi-tone amplitude photomask 120' in the three dimensional view in FIG. 6a. In one embodiment, as the number of layers 70a, 70b, 70c, 70d, 70e increases the thickness of each layer is decreased so some light can get through the bottom four of them. In one embodiment, the full thickness of all layers combined 70a and 70b and 70c and 70d and 70e is sufficient to effectively block exposure of resist on a workpiece while regions with step-wise fewer layers, such as the annular region having layers 70d and 70e, allow correspondingly greater doses of light. With the 3-layer multi-tone amplitude photomask 120 in FIG. 5b, this causes a deeper exposure in photoresist 131 on mask substrate 74 sufficient for developing a deeper 3-dimensional pattern. Similarly, for 5-layer multi-tone amplitude photomask 120'. Thus, the position and number of layers in multi-tone amplitude photomask 120, 120' is reproduced in the photoresist after exposure and development.

In FIG. 6a, openings in photoresist are round, and the largest round opening in resist is for etching top metal layer 70a'. For each subsequent layer of metal down 70b', 70c',

70d', 70e' the opening in the corresponding layer of resist is smaller, to leave metal layers in place with increasingly larger diameter. This scheme in one dimension is also shown in the cross sections of FIGS. 4b-4e for the 3-layer multi-tone amplitude photomask fabrication process.

Figure 6B:
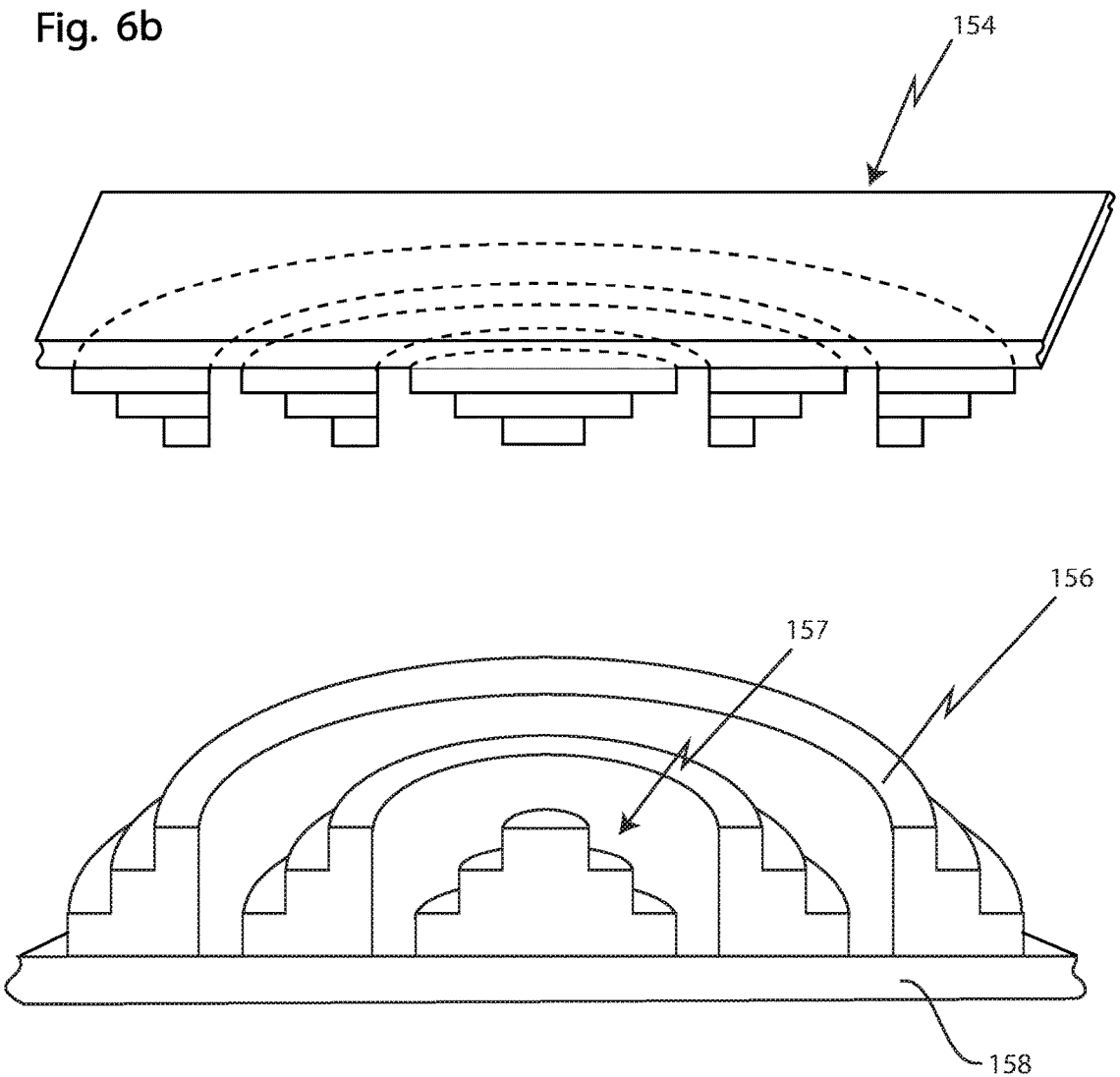
FIG. 6b is a three dimensional view of a multi tone amplitude photo mask with 4 levels formed by the process of the present patent application in a diffractive lens pattern and the 4 levels formed in photo resist on the substrate in a diffractive lens pattern using this photomask.
Figure 6C:
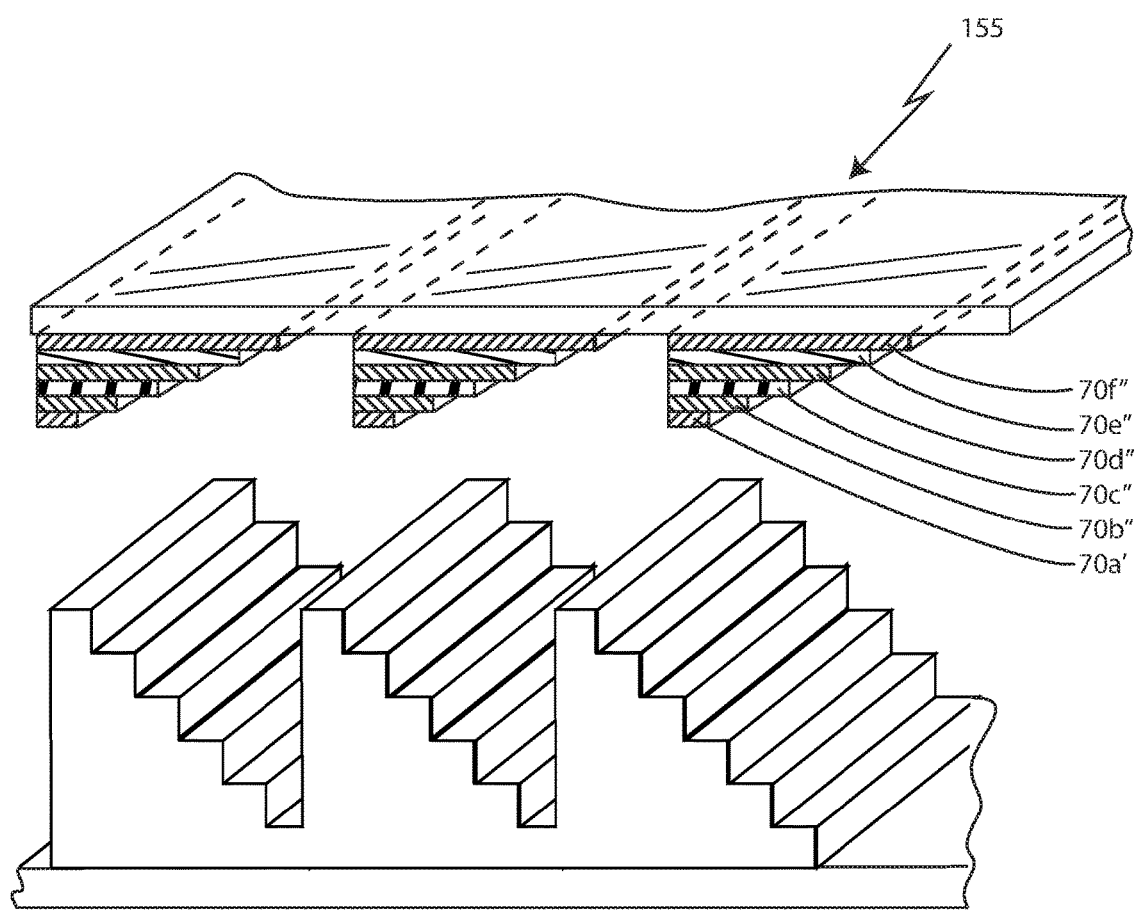
FIG. 6c is a three dimensional view of a multi tone amplitude photo mask with 7 levels formed by the process of the present patent application in a diffraction grating pattern and the 7 levels formed in photo resist on the substrate in a diffraction grating pattern using this photomask.

Other embodiments can have different patterns for the metal layers, such as those multi-layer multi-tone amplitude photomask shown for diffractive lens 154 in FIG. 6b and for diffraction grating 155 in FIG. 6c.

In one embodiment, photoresist 156 for fabricating a diffractive lens is 3 microns tall and each step 157 in photoresist 156 is 1 micron high for focusing light in the infrared range. In another embodiment, an array of 400 of these diffractive lenses was formed, the whole array 20 mm in diameter. Each photoresist lenslet in the array was 500 microns across and 1.7 um tall for focusing light in the near infrared wavelength, 0.85 microns. To fabricate the diffractive lens a directional reactive ion etch was used on photoresist 156 on fused silica workpiece 158 to replicate the photoresist pattern in the fused silica below. In one embodiment, the etch chemistry is adjusted to provide the etch rate approximately the same for photoresist and fused silica. Parameters for such control include oxygen and fluorine precursor gas flow rates and pressures.

To fabricate multi-layer multi-tone amplitude photomask 155 for the diffraction grating with the staircase shape of FIG. 6c, a rectangular opening in each successive resist layer is used in its fabrication. The largest rectangular opening in the first resist applied leaves resist coating only top metal layer 70a" across its width, allowing etching top layer 70a" over all other anticipated steps. Once top layer 70a" is etched except under the first resist, that resist is stripped and a second layer of resist is deposited for coating both top metal layer 70a" and second metal layer 70b" and for allowing etching second metal layer 70b" over all other anticipated steps. The process continues with layers of resist with increasing coating area and decreasing opening size and successively etching metal layers 70c", 70d", 70e", 70f" to create staircase mask 155. As described herein above, different metals with different etch characteristics and different echants are used for the different layers. Alternatively, different dielectrics or dyed polymers and different etchants are used for the different layers.

As with the diffractive lens, the diffraction grating pattern formed in photoresist is replicated in the fused silica workpiece using reactive ion etch. The diffraction grating so formed spreads light striking at an angle into component colors. One application is for use in a spectrometer. In one embodiment, the height of each staircase pattern is in the range from hundreds of nm to tens of microns, the height being related to wavelength of light to be used. Applicant found that the fabrication process described herein above enables control over the width of each stair, the angle of the staircase, the number of stairs in the staircase, and ratio of width to depth in the staircase.

Figure 7E:
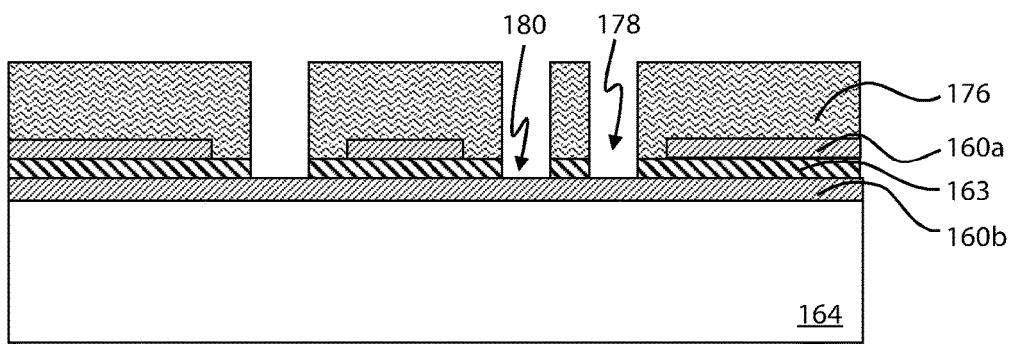

Another embodiment includes an etch stop layer in the multi-tone amplitude photomask, allowing the top and bottom layers to be the same material, as shown in FIGS. 7a-7g. In this embodiment, top and bottom layers of material 160a, 160b are blanket deposited, sandwiching etch stop layer 163 on transparent substrate 164 to begin the fabrication of the multi-tone amplitude photomask, as shown in FIG. 7a. In one example, top and bottom layers 160a, 160b are both chromium, etch stop layer 163 is silicon dioxide, and substrate 164 is glass, quartz, or fused silica. Bottom layer 160b is about 5 nm thick to provide partial transparency to UV light when this bottom layer is alone on substrate 164. Very little UV light passes through in regions having both top layer 160a and bottom layer 160b if top layer 160a is at least 10 nm thick. Top layer 160a can be thicker. Other thicknesses of chromium can be used to tailor vertical dimensions of the photoresist on a workpiece exposed using this mask. Other partially absorbing materials can be used, such as nickel or copper. Top and bottom layers 160a, 160b can be deposited by techniques, such as evaporation, chemical vapor deposition, sputtering, and physical vapor deposition, etch stop layer 163 can be deposited using chemical vapor deposition.

While a 2-layer structure is shown in FIGS. 7a-7d, a structure with more layers can also be fabricated using this process repetitively with an etch stop layer between each metal layer. Applicants found that a layer of silicon dioxide 4 nm thick is sufficient to provide etch stopping.

Once top and bottom layers 160a, 160b and etch stop layer 163 have been deposited, first layer of resist 166 is deposited, as shown in FIG. 7b and patterned to form first openings 168 in patterned first layer of resist 166, as shown in FIG. 7c. In one embodiment first layer of resist 166 is photoresist. The patterning to form first opening 168 in first layer of resist 166 is with UV light through a mask, using laser or electron beam writing exposure or X-ray exposure, followed by developer. Alternatively, a process such as stencil screen printing or roll-on masking material is used to provide patterned first layer of resist 166 during its deposition.

Top layer of material 160a is etched away in conformance to first openings 168 in first layer of resist 166, as also shown in FIG. 7c. In one embodiment, top layer of material 160a is chromium, and is etched away with Transene Chromium Etch TFE in first openings 168 in first layer of resist 166 to form top layer openings 170 in top layer of material 160a. As Transene Chromium Etch TFE will not etch silicon dioxide of etch stop layer 163, both etch stop layer 163 and bottom layer of material 160b remain fully in place, as also shown in FIG. 7c.

First layer of resist 166 is now stripped off and a second layer of resist is deposited and patterned to form second openings 178 in patterned second layer of resist 176, as shown in FIG. 7d. Second openings 178 in patterned second layer of resist 176 are within top layer openings 170 in top layer of material 160a, as shown in FIGS. 7c, 7d. In one embodiment second layer of resist 176 is photoresist. The patterning to form second openings 178 in second layer of resist 176 is with UV light through a mask, using laser or electron beam writing exposure or X-ray exposure, followed by developer. Alternatively, a process such as stencil screen printing or roll-on masking material is used to provide patterned second layer of resist 176 during its deposition.

Etch stop 163 is now etched in conformance to second openings 178 in second layer of resist 176, as shown in FIG. 5e. In one embodiment, etch stop layer 163 is silicon dioxide and is etched away with hydrofluoric acid in second openings 178 in second layer of resist 176 to form openings 180 in etch stop layer 163. As hydrofluoric acid will not etch chromium of bottom layer of material 160b, and as chromium layer 160a is also protected by second layer of resist 176, neither layer of chromium is affected by the oxide etch, as shown in FIG. 7e.

Figure 7F:
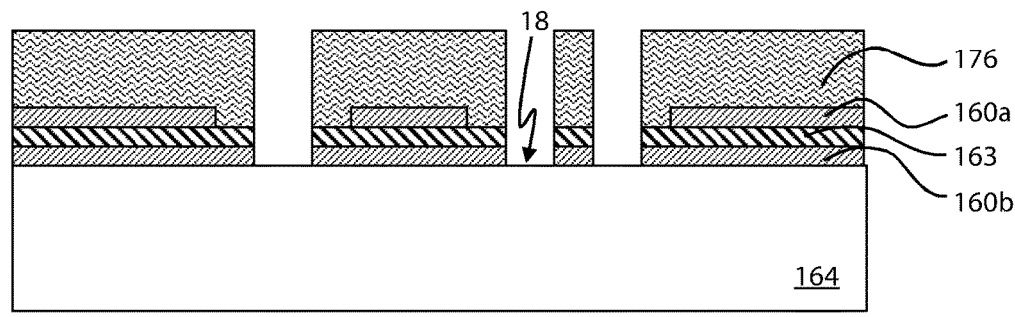

Bottom layer 160b is now etched in conformance to second openings 178 in second layer of resist 176, as shown in FIG. 7f. In one embodiment, bottom layer 160b is chromium and is etched away with Transene Chromium Etch TFE in second openings 178 in second layer of resist 176 to form openings 180 in etch stop layer 163. As Transene Chromium Etch TFE will not etch the glass of substrate 164 and as chromium layer 160*a* is also protected by second layer of resist 176, nothing else is affected by the Transene Chromium Etch TFE, as shown in FIG. 7*f*.

Figure 7G:
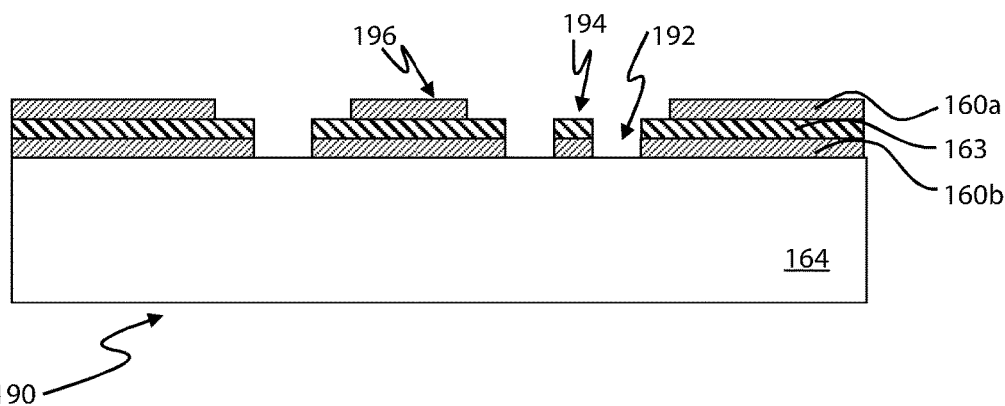

Finally, multi-tone amplitude photomask 190 is completed and ready for use when second photoresist 176 is stripped off, leaving three regions of substrate 164. Regions 192 of substrate 164 have neither layer of material 160*a*, 160*b* nor etch stop layer 163; regions 194 of substrate 164 have bottom layer of material 160*b* and etch stop layer 163 but do not have top layer of material 160*a*, and regions 196 of substrate 164 have both layers of material 160*a*, 160*b* and etch stop layer 163, as shown in FIG. 7*g*. In certain regions, bottom layer of material 160*b* with etch stop layer 163 and top layer of material 160*a* are arranged in staircase pattern 198 on substrate 164.

Multi-tone amplitude photomask 50, 120, 120', 190 are used to fabricate devices that have layered or curved shapes. In one embodiment, 3-layer multi-tone amplitude photomask 120 is used in the fabrication of an array of aerosol nozzles, as shown in FIGS. 8*a*-8*d*. In another embodiment, 3-layer multi-tone amplitude photomask 120 is used in the fabrication of an array of micro lenses, as shown in FIGS. 9*a*-9*d*.

Figure 8A:
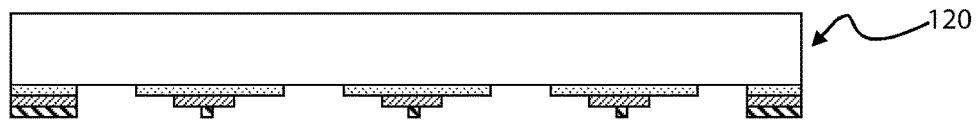
FIGS. 8a-8d are cross sectional views showing the use of a multi-tone amplitude photomask of the present patent application to fabricate an array of aerosol nozzles.
Figure 8B:
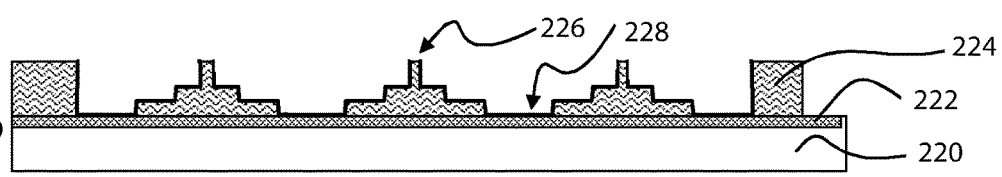

For fabricating the array of aerosol nozzles, workpiece 220, coated with electroplating seed layer 222, and provided with blanket photoresist layer 224, is exposed to ultraviolet light through 3-layer multi-tone amplitude photomask 120, as shown in FIG. 8*a*. After developing photoresist 224 has 4-step staircase structures 226, with cavities 228 there between, as shown in FIG. 8*b*. In one embodiment the lowest step in 4 step photoresist staircase structure 226 is 0.5 microns thick, the second step is 0.5 microns thick, and the highest step is 4 microns thick. The highest step has a diameter that will become the orifice of the nozzle. In one embodiment electroplating seed layer 222 is sputtered nickel with a thickness in the range from about 5 nm to about 500 nm on sputtered chromium with a thickness in the range from 1 to 2 nm. The seed layer is allowed to oxidize to form a passivation that allows later release of electroplated material from seed layer 222. Seed layers can also be provided on workpiece 220 using evaporation, ion beam deposition, physical vapor deposition, and laser deposition.

Figure 8C:
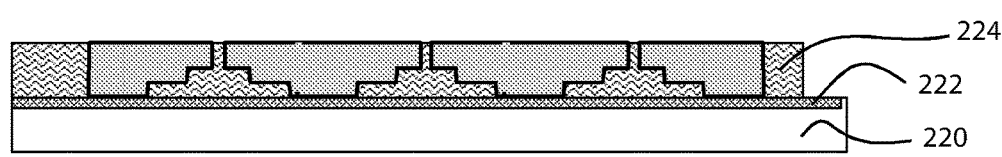

Workpiece 220 is now electrically connected for electroplating through plating seed layer 222 as masked by 4-step staircase photoresist structures 226, as shown in FIG. 8*c*, and electroplated palladium nickel alloy fills cavities 228 between 4-step staircase photoresist structures 226. Other noble metals and alloys including noble metals can be used.

Figure 8D:
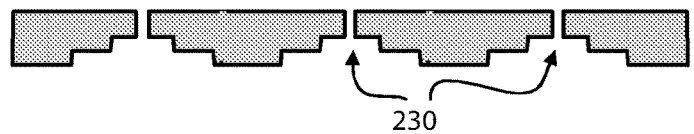

Photoresist 224, 226 is now removed, such as in an acetone bath, leaving array of electroplated palladium nickel alloy micro nozzles 230 which are released from substrate 220 mechanically, by peeling, as shown in FIG. 8*d*. The process allows each nozzle of the array of nozzles to have an orifice defined by the highest step in photoresist structure 226 having a diameter in the range from 2.5 to 4.5 microns.

Figure 9A:
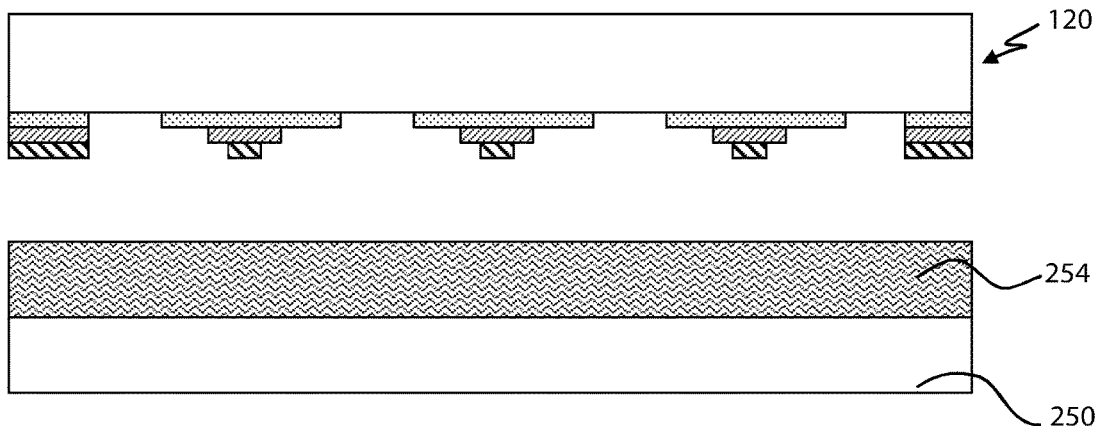
FIGS. 9a-9d are cross sectional views showing the use of a multi-tone amplitude photomask of the present patent application to fabricate an array of micro lenses.
Figure 9B:
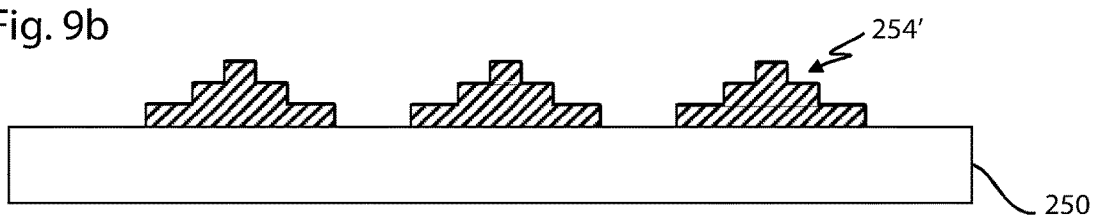

For fabricating the array of micro lenses, workpiece 250 is provided with blanket photoresist layer 254, and is exposed to ultraviolet light through 3-layer multi-tone amplitude photomask 120, as shown in FIG. 9*a*. For the lenses, workpiece 250 is fabricated of a material, such as fused silica. After developing photoresist 254 has the 3-step cone structures 254', as shown in FIG. 9*b*.

Figure 9C:
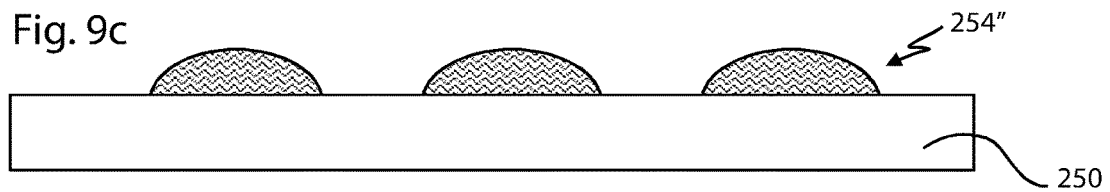

Workpiece 250 with its photoresist 3-step cone structures 254' is now subjected to baking at 150 degrees C. to melt photoresist 3-step cone structures 254', as shown in FIG. 9*c*, creating lens-shaped regions of photoresist 254" on fused silica workpiece 250.

Figure 9D:
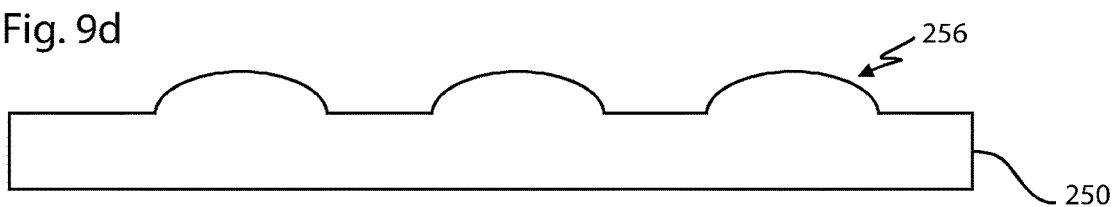

Workpiece 250 with its lens-shaped regions of photoresist 254" is now subjected to reactive ion etching which transfers lens shaped regions of photoresist 254" into fused silica workpiece 250, as shown in FIG. 9*d*, creating array of micro lenses 256 on fused silica workpiece 250. Conditions for the reactive ion etch are 300 Watts, CF4 at 45 standard cubic centimeters per minute, $O_2$ at 5 standard cubic centimeters per minute, 200 mTorr for 40 minutes using a Phantom II reactive ion etch tool, from Trion Technology, Clearwater, Fla.

In another embodiment, a 3-D printer is used to deposit each layer of dyed polymer for the photomask, as shown in FIG. 6*a*. In this case, layers 7*a*'-7*e*' are each in the range from 1 micron to tens of microns thick. In one embodiment, all layers have the same thickness and the same transmissivity so regions with multiple layers have correspondingly reduced transmissivity depending on the number of layers through which an exposure beam travels. In another embodiment different layers result in different reflectivities from a highly reflective mask substrate depending on the thickness of the dyed polymer absorbing light in both passes as it travels to and from the highly reflective mask substrate.

The 3-D printer can be a standard ink-jet printer in which successive layers of ink are deposited one after another. In one example, the dye or pigment concentration in the ink or polymer binder is selected so each layer of ink deposited has a transmissivity such as 80%. In another example, each layer has a transmissivity of 65% so light penetrating five layers would have its intensity diminished to 5% of the incident intensity. In another example the different print heads of the ink-jet printer are used to print inks with different transmissivities so each layer can have its own transmissivity.

Figure 11:
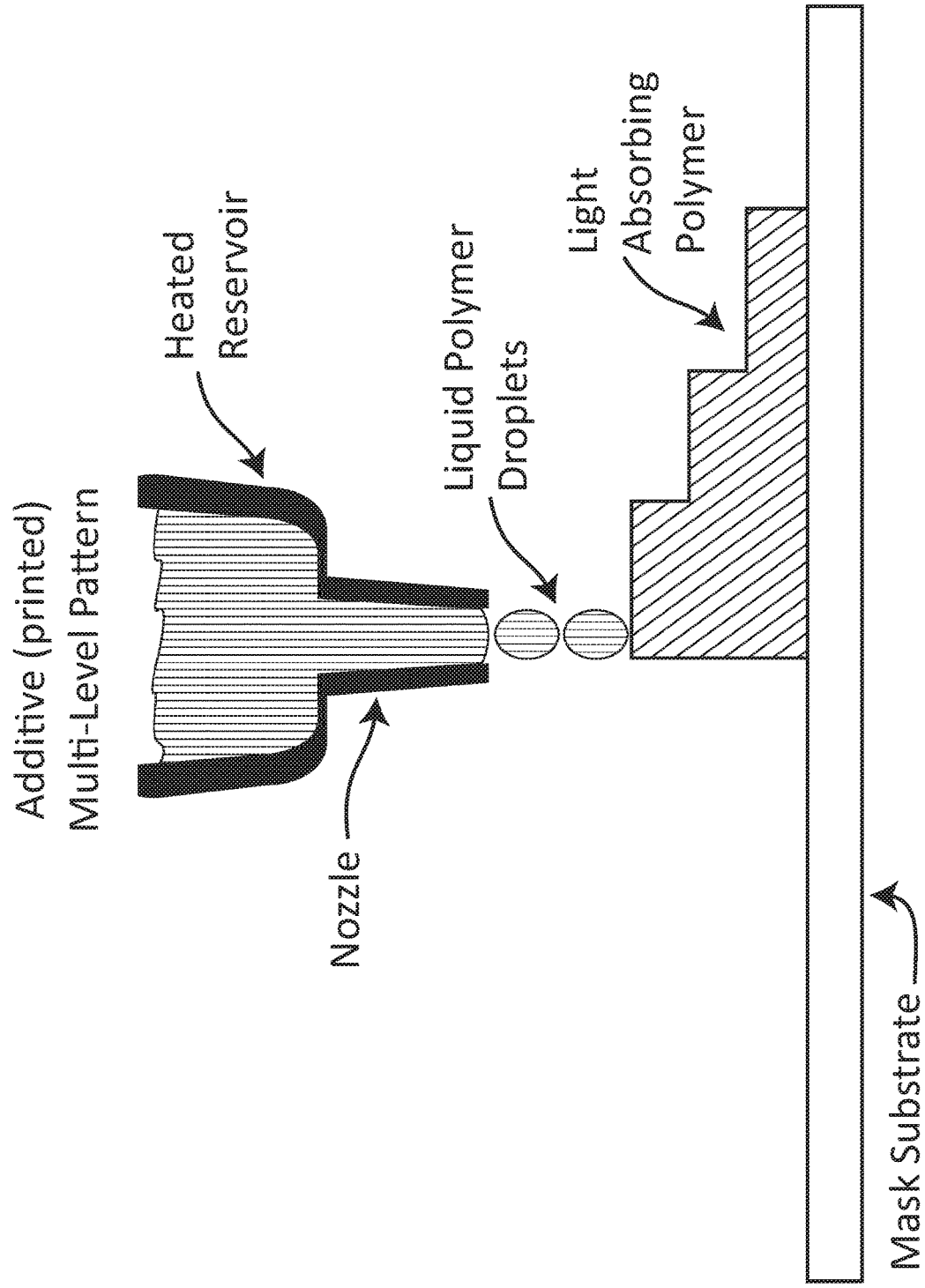
FIG. 11 is a cross sectional view showing an additive process to form a stepped pattern in the light absorbing polymer using a printer that provides liquid polymer droplets.

Other methods of additive manufacture, such as chemical vapor deposition through a mask or on a previously deposited patterned precursor layer on the mask substrate, can be used to make multi-tone amplitude photo masks. Additive printing, such as with a nozzle that provides liquid polymer droplets, can be used to form the light absorbing polymer stepped pattern, as shown in FIG. 11. Other metal, dielectric, or polymer materials, two dimensional materials, such as graphene, and other materials with desired transmissivities or reflectivities can also be used.

While several embodiments, together with modifications thereof, have been described in detail herein and illustrated in the accompanying drawings, it will be evident that various further modifications are possible without departing from the scope of the invention as defined in the appended claims. Nothing in the above specification is intended to limit the invention more narrowly than the appended claims. The examples given are intended only to be illustrative rather than exclusive.

What is claimed is:

1. A method of fabricating a multi-tone amplitude photomask, comprising
   a. providing a mask substrate; and
   b. providing a stepped pattern in at least one layer of material on a surface of said mask substrate, wherein said stepped pattern includes at least two steps and at least three levels, wherein each level of said stepped pattern provides a different intensity of light when a light source shines light on said stepped pattern.

2. A method as recited in claim 1, wherein said providing a stepped pattern in said at least one layer of material on said surface of said mask substrate includes providing a layer of a polymer on said mask substrate and ablating or etching said layer of polymer to form a pattern in said polymer wherein said pattern in said polymer includes a first portion having a first thickness and a second portion having a second thickness.

3. A method as recited in claim 2, wherein said ablating includes laser ablating with a scanning laser.

4. A method as recited in claim 2, wherein said ablating includes ablating with a holographic mask.

5. A method as recited in claim 2, wherein said etching includes plasma etching or reactive ion etching through a mask.

6. A method as recited in claim 1, wherein said providing a stepped pattern in at least one layer of material on a surface of a mask substrate includes additively providing patterned layers of polymer on said mask substrate to provide said stepped pattern.

7. A method as recited in claim 1, wherein said providing a stepped pattern in at least one layer of material on a surface of a mask substrate includes:
   a. providing a first blanket layer of material on said mask substrate;
   b. providing a second blanket layer of material on said first blanket layer of material; and
   c. etching said first blanket layer and said second blanket layer to form said stepped pattern including a first pattern in said first layer and a second pattern in said second layer wherein said stepped pattern includes a first region having none of said first layer and none of said second layer, a second region having said first layer and none of said second layer, and a third region having both said first layer and said second layer.

8. A method as recited in claim 1, wherein said providing said stepped pattern on said surface of said mask substrate includes:
   a. providing at least one material on said surface of said mask substrate;
   b. providing a first resist on said at least one material wherein a first opening in said resist extends completely through said first resist and wherein said first opening includes a first region along said surface;
   c. etching a first etched pattern in said at least one material defined by said first opening wherein said first etched pattern extends only part way through said at least one material and leaving a remaining portion of said at least one material;
   d. providing a second resist on said at least one material wherein a second opening in said second resist extends completely through said second resist, wherein said second opening extends above said first region; and
   e. etching a second etched pattern in said at least one material defined by said second opening wherein said second etched pattern extends at least partially through a remaining portion of said at least one material to provide said stepped pattern in said at least one material on said mask substrate, wherein said second etch pattern is aligned to said first etch pattern.

9. A method as recited in claim 8, wherein said at least one material includes a first material and a second material, wherein said first material has a first etch characteristic and said second material has a second etch characteristic, wherein said first etch characteristic is different from said second etch characteristic, wherein said first and said second etch characteristics allow in etching (c) etching all the way through said first material without substantially etching said second material, and etching all the way through said first material without substantially etching said second material.

10. A method as recited in claim 9, wherein said etching (e) involves etching all the way through said second material without etching said mask substrate.

11. A method as recited in claim 10, wherein said first material includes a first metal and wherein said second material includes a second metal, wherein said second metal is sufficiently thin to provide said at least one from the group consisting of successively increasing transparency and successively increasing reflectivity of said stepped pattern from step to step on said surface of said mask substrate.

12. A method as recited in claim 10, wherein said second metal has a thickness less than to 300 nm.

13. A method as recited in claim 9, wherein said second material includes a sacrificial etch stop material.

14. A method as recited in claim 13, wherein said first material extends above said sacrificial etch stop material and wherein said first material extends below said sacrificial etch stop material.

15. A method as recited in claim 9, wherein said at least one material further includes a third material, wherein said third material has a third etch characteristic, wherein said second etch characteristic is different from said third etch characteristic, wherein said second and third etch characteristics allows in etching (e) etching all the way through said second material without substantially etching said third material, and further comprising etching all the way through said second material without substantially etching said third material, further comprising:
   a. providing a third resist on said at least one material after (e) wherein a third opening in said third resist extends completely through said third resist, wherein said third opening extends above said second region and wherein said third opening includes a third region along said surface; and
   b. etching a third etched pattern in said at least one material defined by said third opening wherein said third etched pattern extends at least partially through a remaining portion of said at least one material.

16. A method as recited in claim 9, further comprising:
   a. providing a workpiece;
   b. providing photoresist on said workpiece;
   c. providing a dose of light to said stepped pattern on said surface of said mask substrate to expose said photoresist on said workpiece;
   d. developing to form a stepped pattern in said photoresist on said workpiece based on said different levels of intensity of light when measured at the mask and when a light source shines light on said stepped pattern, wherein after said developing, no photoresist exists on said workpiece surface in said second etched pattern, wherein a first thickness of photoresist extends above said workpiece surface between said second etched pattern and said first etched pattern, and wherein a second thickness of photoresist extends above said workpiece surface beyond said first etched pattern, wherein said second thickness is greater than said first thickness.

17. A method as recited in claim 16, further comprising transferring said stepped pattern in said photoresist on said workpiece into a device.

18. A method as recited in claim 17, wherein said transferring said stepped pattern in said photoresist includes electroplating a metal.

19. A method as recited in claim 18, further comprising removing said resist to form an array of nozzles.

20. A method as recited in claim 19, wherein said metal includes a noble metal.

21. A method as recited in claim 19, wherein said array of nozzles each has an orifice, wherein said orifice has a diameter in the range from 2.5 to 4.5 microns.

22. A method as recited in claim 17, wherein said transferring said stepped pattern in said photoresist includes baking said resist to form a lens shape and reactive ion etching to form an array of lenses.

23. A method as recited in claim 17, wherein said transferring said stepped pattern in said photoresist includes reactive ion etching to form an array of diffractive optical elements.

\* \* \* \* \*